United States Patent
Lim et al.

(10) Patent No.: US 7,982,245 B2
(45) Date of Patent: Jul. 19, 2011

(54) CIRCUIT WITH FUSE/ANTI-FUSE TRANSISTOR WITH SELECTIVELY DAMAGED GATE INSULATING LAYER

(75) Inventors: Jun-hee Lim, Seoul (KR); Choong-sun Shin, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 617 days.

(21) Appl. No.: 12/029,618

(22) Filed: Feb. 12, 2008

(65) Prior Publication Data

US 2008/0197911 A1    Aug. 21, 2008

(30) Foreign Application Priority Data

Feb. 16, 2007 (KR) .................. 10-2007-0016796

(51) Int. Cl.
*H01L 23/52* (2006.01)
(52) U.S. Cl. ........................ 257/209; 257/208
(58) Field of Classification Search .................. 257/209, 257/208
See application file for complete search history.

(56) References Cited

U.S. PATENT DOCUMENTS

| | | | | |
|---|---|---|---|---|
| 6,096,580 A | * | 8/2000 | Iyer et al. ............... | 438/132 |
| 6,580,145 B2 | * | 6/2003 | Wu et al. ............... | 257/530 |
| 6,710,415 B2 | * | 3/2004 | Ariyoshi et al. ......... | 257/392 |
| 6,753,590 B2 | * | 6/2004 | Fifield et al. ........... | 257/529 |
| 6,812,542 B2 | * | 11/2004 | Kohyama ............... | 257/530 |
| 6,902,958 B2 | * | 6/2005 | Ito et al. ............... | 438/131 |

FOREIGN PATENT DOCUMENTS

| | | |
|---|---|---|
| JP | 05082641 | 4/1993 |
| JP | 2001308283 | 11/2001 |
| JP | 2003168734 | 6/2003 |
| KR | 1020010030493 A | 4/2001 |
| KR | 1020010061008 A | 7/2001 |
| KR | 1020040059819 A | 7/2004 |
| KR | 1020060052311 A | 5/2006 |

* cited by examiner

*Primary Examiner* — Douglas M Menz
(74) *Attorney, Agent, or Firm* — Volentine & Whitt, PLLC

(57) ABSTRACT

A semiconductor integrated circuit is disclosed which includes a main transistor and at least one of a fuse transistor or an anti-fuse transistor ("fuse/anti-fuse transistor"). Each transistor type includes an active region formed in a semiconductor substrate, a gate stack comprising a gate insulation layer and a gate electrode sequentially formed on the active region, and source/drain regions separated across the gate stack, but the gate insulation layer of the fuse/anti-fuse transistor is selectively damaged during fabrication.

10 Claims, 5 Drawing Sheets

CIRCUIT WITH FUSE/ANTI-FUSE TRANSISTOR WITH SELECTIVELY DAMAGED GATE INSULATING LAYER

CROSS-REFERENCE TO RELATED PATENT APPLICATION

A claim of priority is made to Korean Patent Application No. 10-2007-0016796, filed Feb. 16, 2007, in the Korean Intellectual Property Office, the disclosure of which is incorporated herein in its entirety by reference.

BACKGROUND OF THE INVENTION

1. Field of the Invention

The present invention relates generally to semiconductor integrated circuits. More particularly, the invention relates to semiconductor integrated circuits including a fuse and/or an anti-fuse.

2. Description of the Related Art

A semiconductor integrated circuit such as a memory device and a logic device may utilize a trimming circuit or a redundancy circuit to remedy the effects of certain circuit defects commonly generated during fabrication. For example, a redundant circuit is sometimes fabricated in parallel with a primary circuit. The primary circuit is then tested, and if it is functioning properly, the redundant circuit may be removed or isolated from the overall device. In contrast, if the primary circuit is defective, the redundant circuit, or a portion of the redundant circuit may be enabled to operate in place of or in conjunction with the primary circuit.

Programmable fuses and/or anti-fuses are conventionally used to alternately enable or isolate a redundant circuit. In this context, a fuse is a low resistance element that may be permanently programmed into a high resistance state, whereas an anti-fuse is a high resistance element that may be permanently programmed into a low resistance state. For example, if a primary circuit is found to be operating normally (i.e., is non-defective), a corresponding redundant circuit may be isolated from the primary circuit by applying energy to one or more programmable fuse(s), thereby forming an open circuit between the primary circuit and redundant circuit. On the other hand, if the primary circuit is found to be defective, the redundant circuit may be operationally included with (or substituted for) the primary circuit by applying energy to programmable anti-fuse to form a closed circuit electrically bridging the primary circuit with the redundant circuit. In addition to selective enablement of redundant circuits, fuses and anti-fuses may alternately or additionally be used in conjunction with program trimming circuits, such as resistive trimming circuits.

Laser energy or electrical energy is typically used to program fuses and anti-fuses. The use of laser energy is generally limited to sequential programming processes for fuses and anti-fuses, but such processes take considerable time. In addition, laser systems are quite expensive and their operation sometimes results in contamination problems. Programming with electrical energy, on the other hand, is relatively quick, inexpensive, and creates no contamination issues. As such, electrical programming has been predominantly used in the fabrication of semiconductor devices.

For the electrical programming, it is desirable that the ratio of fuse and anti-fuse resistance after programming be higher than before programming. It is also desirable for the applied electrical power to be relatively low power and its application to be relatively short in duration.

An electrical fuse may be implemented using with a transistor, (i.e., a transistor type electrical fuse). By selectively breaking down the gate insulation layer of a transistor type electrical fuse, an anti-fuse type transistor can be provided. When a transistor is used as the electrical fuse, although the constituent gate insulation layer of the transistor may have a thickness of about 24 Å this very thin gate insulation layer may nonetheless have a high dielectric breakdown voltage of 4.5 to 4.8V.

Since the high dielectric breakdown voltage associated with a transistor type electrical fuse requires a correspondingly high voltage and current driving capability of a control circuit, the control circuit will occupy a relatively large area of an incorporating semiconductor device. Thus, it may be difficult to improve the integration density of an integrated circuit device incorporating the control circuit. In addition, application of the high dielectric breakdown voltage may cause related programming failures. Furthermore, the reliability of a corresponding driving circuit may deteriorate under the effects of a relatively high voltage required for fuse programming.

SUMMARY OF THE INVENTION

Embodiments of the invention provide a semiconductor integrated circuit including an electrical fuse having a transistor structure which may be programmed using a reduced driving voltage.

In one embodiment, the invention provides a semiconductor integrated circuit comprising a main function transistor and at least one of a fuse transistor or an anti-fuse transistor ("fuse/anti-fuse transistor), each comprising; an active region formed in a semiconductor substrate, a gate stack comprising a gate insulation layer and a gate electrode sequentially formed on the active region, and source/drain regions separated across the gate stack, wherein the gate insulation layer of the fuse/anti-fuse transistor is selectively damaged during fabrication.

DESCRIPTION OF EMBODIMENTS

Figure 1:
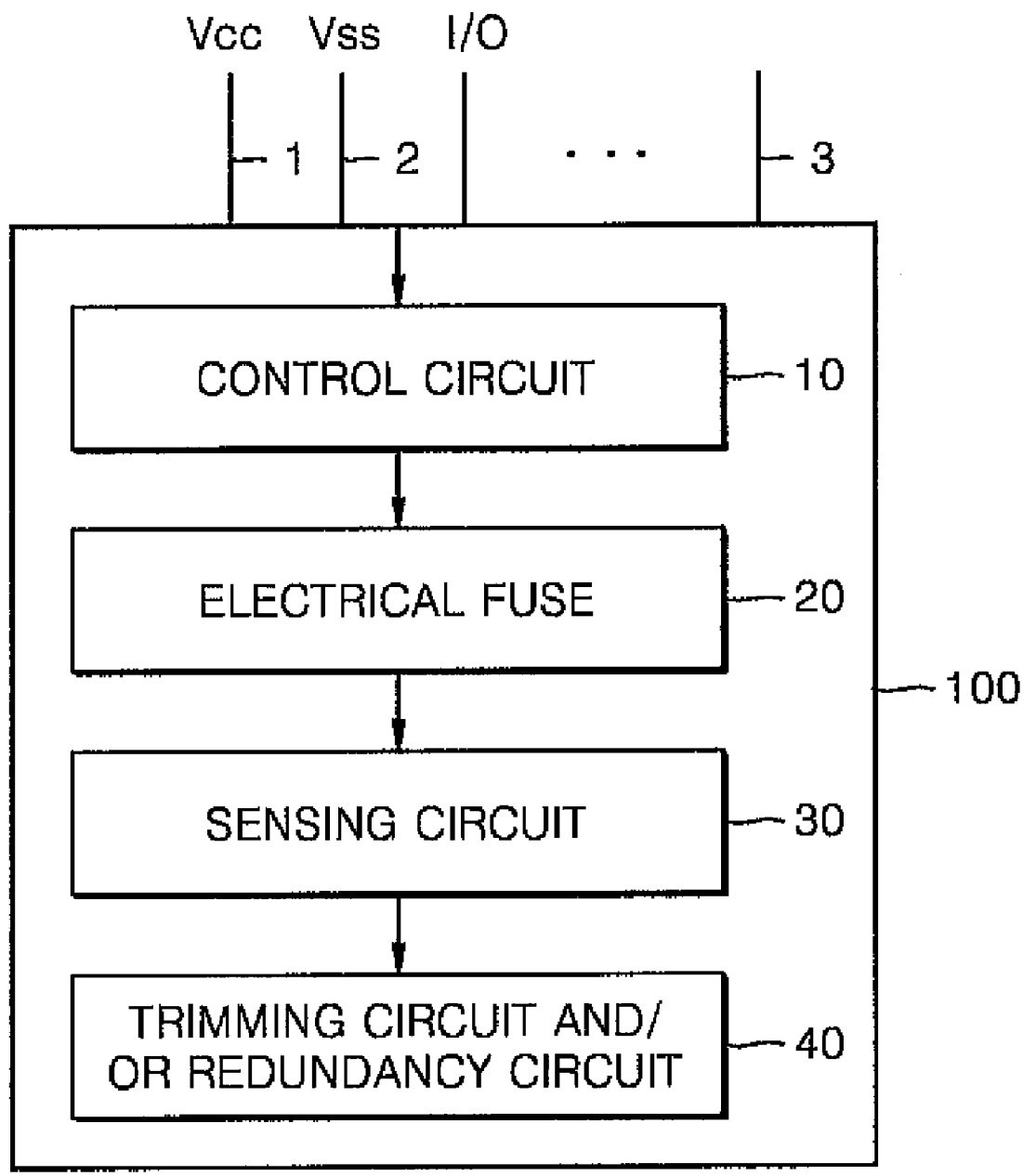
FIG. 1 is a schematic block diagram illustrating a semiconductor integrated circuit including an electrical fuse according to an embodiment of the invention.

Several embodiments of the invention will now be described with reference to the accompanying drawings. The invention may, however, be embodied in many different forms and should not be construed as being limited to only the illustrated embodiments.

Elements and semiconductor regions shown in the drawings are not necessarily drawn to scale, and the dimensions of certain layers and regions may have been exaggerated for clarity. Throughout the drawings and written description, like reference numerals are used to denote like or similar elements.

In the description, when a layer is referred to as being "on" another layer or substrate, it may be directly on the other layer or substrate, or intervening layers may also be present. Also, although numerical terms (e.g., "first" and "second") are used herein to describe various members, parts, regions, layers and/or sections, these members, parts, regions, layers and/or sections are not to be limited by these terms. These terms are only used to distinguish one member, part, region, layer or section from another member, part, region, layer or section. Thus, for example, a first member, part, region, layer or section discussed below could be termed a second, part, region, layer or section without departing from the teachings of the illustrated embodiments.

Figure (FIG.) 1 is a schematic block diagram illustrating a semiconductor integrated circuit 100 according to an embodiment of the invention.

Referring to FIG. 1, semiconductor integrated circuit 100 includes one or more terminals such as power terminals and signal terminals. For example, the power terminals may include a power voltage source terminal (Vcc) 1 and a ground voltage source terminal (Vss) 2. The signal terminals may include a signal terminal (I/O) 3 for transmitting I/O signals. Voltage applied from power terminals 1 and 2 is increased and a low level signal transmitted from signal terminal 3 is converted to a programming signal having an appropriate voltage and current level for programming by a control circuit 10 connected to an electrical fuse 20. The programming signal generated by the control circuit 10 is supplied to electrical fuse 20, and thus the electrical fuse 20 may be programmed. A sensing circuit 30 connected to electrical fuse 20 converts resistance value of programmed electrical fuse 20 to corresponding voltage signal to read whether electrical fuse 20 is programmed or not. Then, trimming circuit and/or redundancy circuits 40 are isolated from and/or coupled electrically to a basic circuit (not shown) in the semiconductor integrated circuit.

Electrical fuse 20 may be implemented using a transistor. According to the requirements of the incorporating host device, (e.g., requirements that may vary per different devices such as microprocessors, digital signal processors, memory devices, analog devices, etc.), various transistor types may be used. However, hereinafter the chosen type of transistor will be referred to as a "main function transistor". When the host device having a circuit including the main function transistor is used, electrons injected from a constituent channel region to the gate insulation layer or impurities included in the gate insulation layer and/or unstable energy states formed on an interface between the channel region and the gate insulation layer may gradually cause deterioration in the insulating effects of the gate insulation layer of the main function transistor, and, thus, the performance of the main function transistor may degrade over time.

Therefore, the gate insulation layer in a main function transistor generally requires highly reliable bulk properties and interface properties between itself and an underlying active region. However, when a "damaged" (i.e., having reduced insulating properties) insulating layer is used in electrical fuse 20 (i.e., a fuse transistor), the corresponding driving voltage required to program the electrical fuse may be reduced. This allows for a more rapid and reliable programming process. In addition, because periphery circuits such as control circuit 10 are not required to generate such high programming voltages, they may be better miniaturized, thereby improving overall integration density.

Therefore, certain embodiments of the invention make effective use of a damaged gate insulation layer within a fuse transistor. However, a damaged gate insulation layer in a main function transistor will also result in a reduced driving voltage for the main function transistor. Thus, certain additional embodiments of the invention make effective use of a damaged gate insulation layer in a main function transistor.

For example, a semiconductor integrated circuit may comprise a plurality of transistors, and each one of the plurality of transistors may comprise an active region formed in a semiconductor substrate, a gate stack including sequentially formed gate insulation layer and gate electrode, and source/drain regions spaced apart from each other in the active region and separated by the gate stack. However, in certain embodiments of the invention one or more of the plurality of transistors may have its gate insulation layer selectively damaged during fabrication.

In one embodiment of the invention, the selective damage of a main transistor amongst a plurality of otherwise normally formed transistors may be accomplished by means of a gate electrode contact hole disposed on a portion of the gate electrode overlapping the damaged gate insulation layer.

The gate electrode of the transistor may be formed with an integral plasma antenna region, and additionally the plasma antenna region may be expanded on a device isolation layer defining the active region in the semiconductor region.

In certain embodiments of the invention, the damaged gate insulation layer may comprise an implanted impurity region.

Hereinafter, certain exemplary embodiments of the invention including a transistor with a damaged gate insulation layer will be described. The embodiments that follow include at least a fuse transistor and a main function transistor. From the description that follows, it may be understood that when the same fabrication process such as an etching process is performed for a plurality of transistors including a main function transistor and a fuse transistor, a damaged gate insulation layer may be selectively provided for certain one of the transistors, such as for example, the fuse transistor.

Figure 2A:
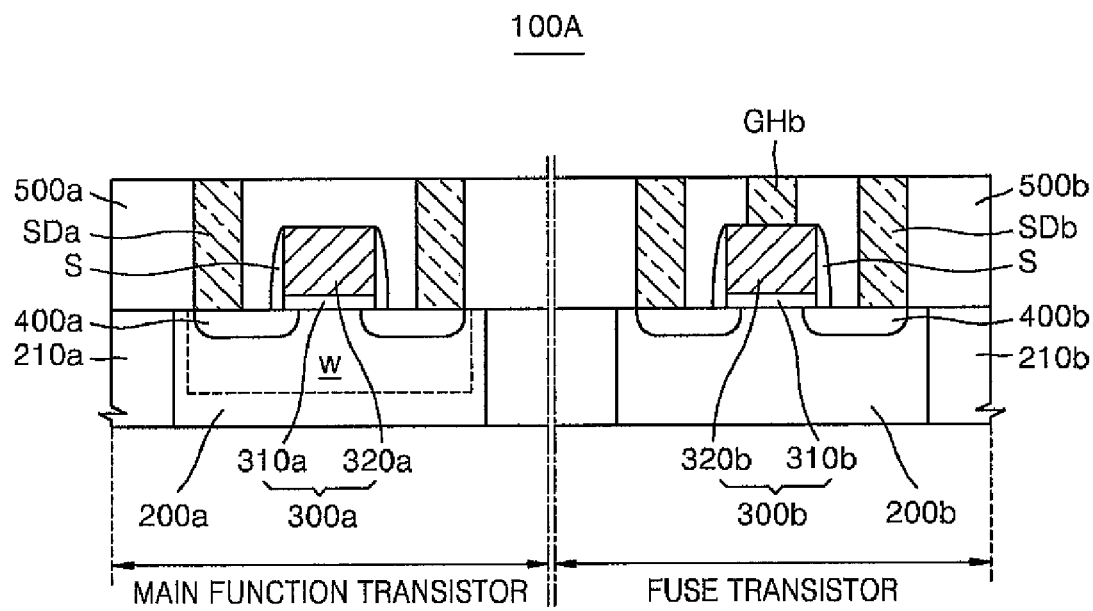
FIGS. 2A and 2B are related sectional and plan views illustrating a semiconductor integrated circuit including a plurality of transistors according to an embodiment of the invention.
Figure 2B:
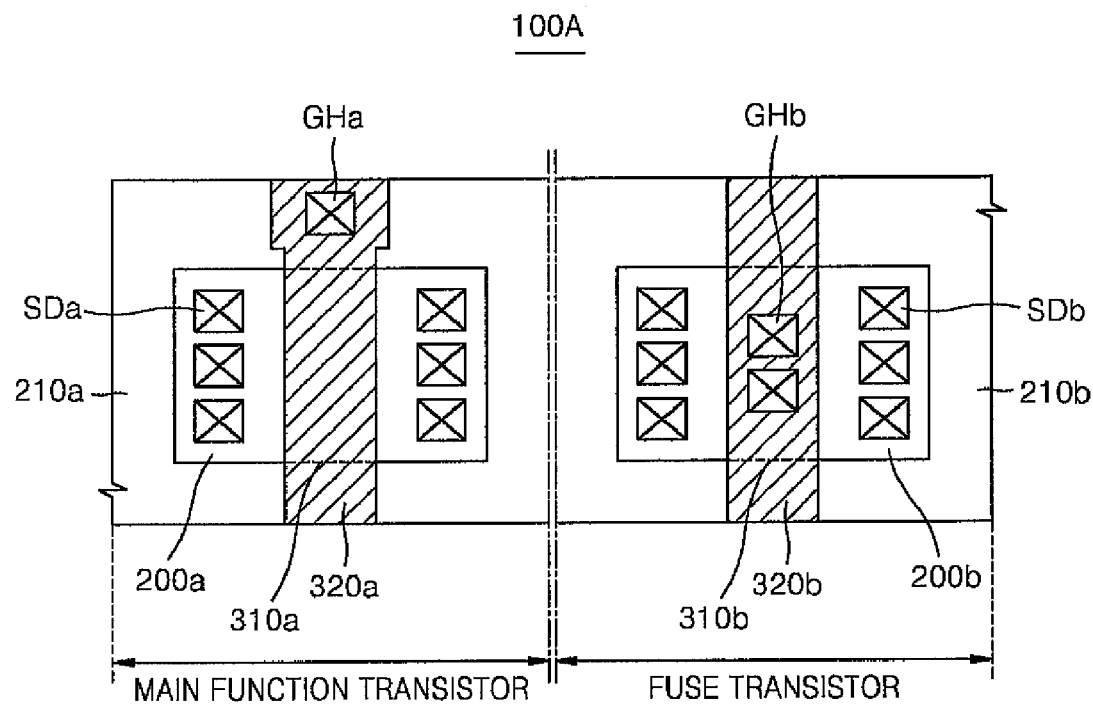

FIGS. 2A and 2B are related sectional and plan views illustrating a semiconductor integrated circuit 100A comprising a plurality of transistors according to an embodiment of the invention.

Referring to FIGS. 2A and 2B, the transistors of semiconductor integrated circuit 100A includes first conductive type active regions 200a and 200b, gate stacks 300a and 300b including gate insulation layers 310a and 310b and gate electrodes 320a and 320b sequentially formed on the first conductive type active regions 200a and 200b, and second conductive type source/drain regions 400a and 400b spaced apart from each other in the active region 200a and 200b with the gate stack 300a and 300b disposed therebetween. For example, the first conductive type may be N-type, and the second conductive type may be P-type. Spacers "S" may be formed on sidewalls of the gate stacks 300a and 300b.

The transistors of the semiconductor integrated circuit 100A include a main function transistor and a fuse transistor, as indicated in FIGS. 2A and 2B. The main function transistor may have a conventional structure. For example, in the illustrated embodiment, the gate electrode contact hole GHa of the main function transistor is disposed on a portion of the gate electrode 320a where a gate insulation layer 310a doesn't overlap the gate electrode 320a. The fuse transistor has the same structure as the main function transistor except that a gate electrode contact hole GHb of the fuse transistor is disposed on a portion of the gate electrode 320b overlapping the gate insulation layer 310b. But, as explained above, the gate electrode contact hole GHa of the main function transistor may be disposed on a portion of the gate electrode 320a overlapping the gate insulation layer 310a.

The gate electrode contact holes GHa and GHb may be formed using a dry etching method, such as a plasma dry etching. When the gate electrode contact hole GHb is formed on the portion of the gate electrode 320b overlapping the gate insulation layer 310b using the dry etching method, the gate insulation layer 310b under the gate electrode 320b may be damaged by an electric potential difference generated during the dry etching for forming the gate electrode contact hole GHb, thereby providing a lowed driving voltage for the fuse transistors.

According to an embodiment of the present invention, the gate electrode contact hole GHa of the main function transistor and the gate electrode contact hole GHb of the fuse transistor may be disposed in different regions, respectively. For example, the gate electrode contact hole GHa of the main function transistor is disposed on a device isolation layer 210a, not on the portion of the gate electrode 320a overlapping the gate insulation layer 310a. The gate electrode contact hole GHb of the fuse transistor is disposed on the portion of the gate electrode 320b overlapping the gate insulation layer 310b. Therefore, only the gate insulation layer 310b of the fuse transistor can be selectively damaged even when the same etching process for forming contact holes GHa and GHb is performed on the main function transistor and the fuse transistor.

Figure 3A:
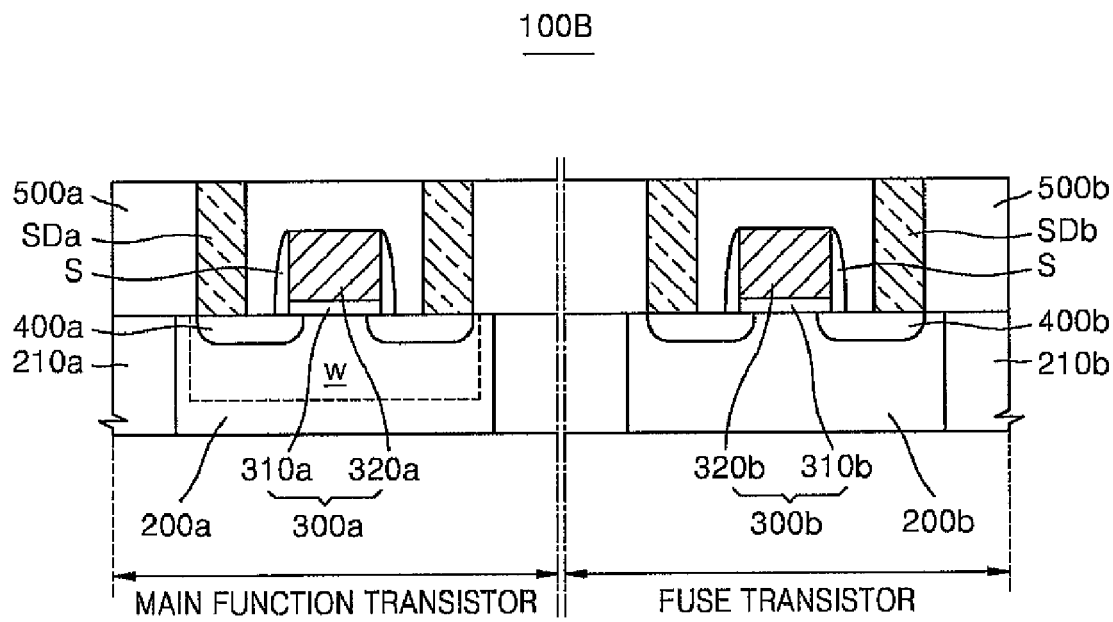
FIGS. 3A and 3B are related sectional and plan views illustrating a semiconductor integrated circuit including a plurality of transistors according to another embodiment of the invention.
Figure 3B:
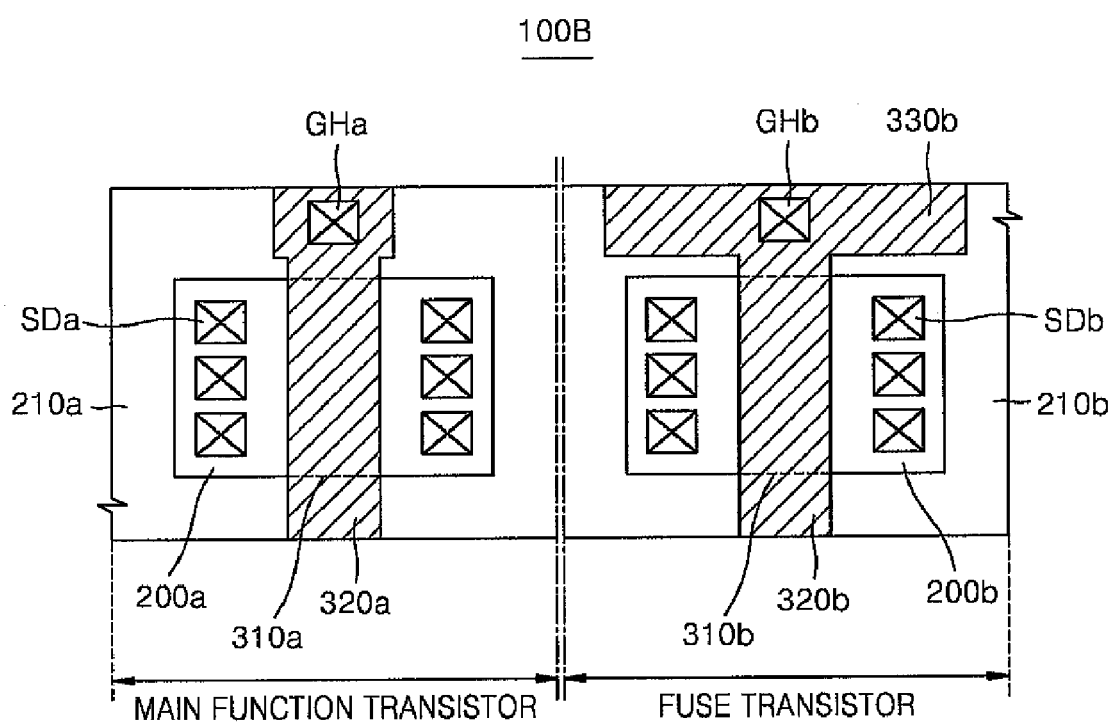

FIGS. 3A and 3B are related sectional and plan views illustrating a semiconductor integrated circuit 100B including a plurality of transistors according to another embodiment of the invention.

Referring to FIGS. 3A and 3B, the semiconductor integrated circuit 100B comprises a main function transistor and a fuse transistor having different respective gate electrodes 320a and 320b. As described above, the main function transistor may have a conventional structure, while the gate electrode 320b of the fuse transistor may include a plasma antenna region 330b having an expanded width or length relative to the gate electrode 320a of the main function transistor.

The plasma antenna region 330b of the fuse transistor functions as an antenna. That is, the plasma antenna region 330b effectively receives charged particles which are diffused or drifted from the plasma during dry etching process for forming the gate electrode 320b. Therefore, only the gate insulation layer 310b of the fuse transistor is selectively damaged.

The plasma antenna region 330b of the gate electrode 320b may be disposed outside a region in which a gate insulation layer 310b overlaps the gate electrode 320b. In some embodiments, the plasma antenna region 330b may be formed on the device isolation layer 210b defining the active region 200b, so that the problem of a small active region due to the reduction of design rules does not challenge the formation of the plasma antenna region 330b. The greater the area of the plasma antenna region 330b, the more damaged the gate insulation layer 310b. Therefore, the width and length of the plasma antenna region 330b can be designed to control the driving voltage for fuse transistors.

Figure 4A:
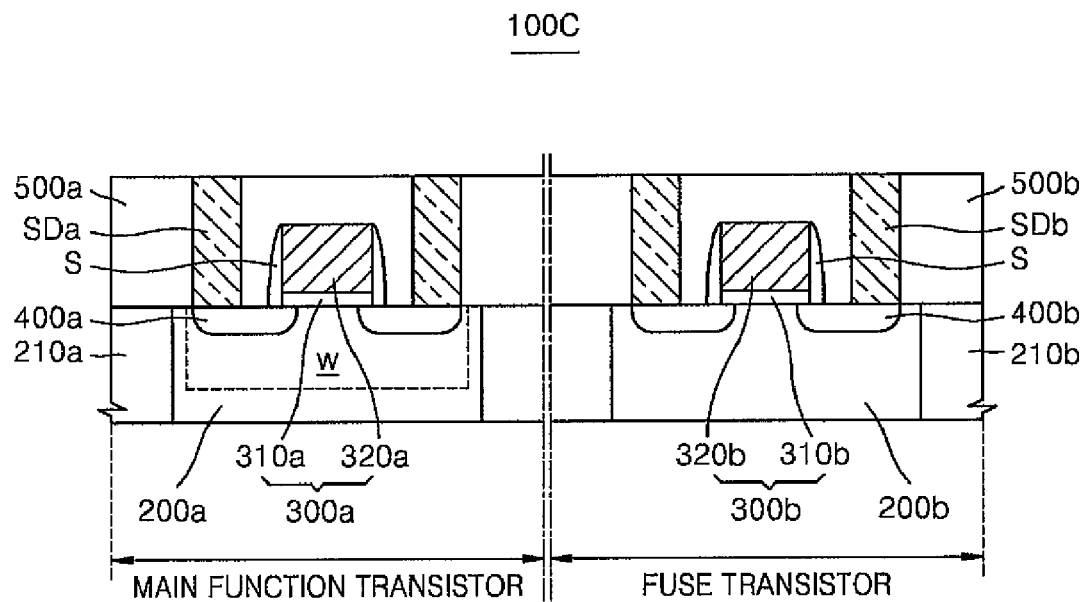
FIGS. 4A and 4B are related sectional and plan views illustrating a semiconductor integrated circuit including a plurality of transistors according to another embodiment of the invention.
Figure 4B:
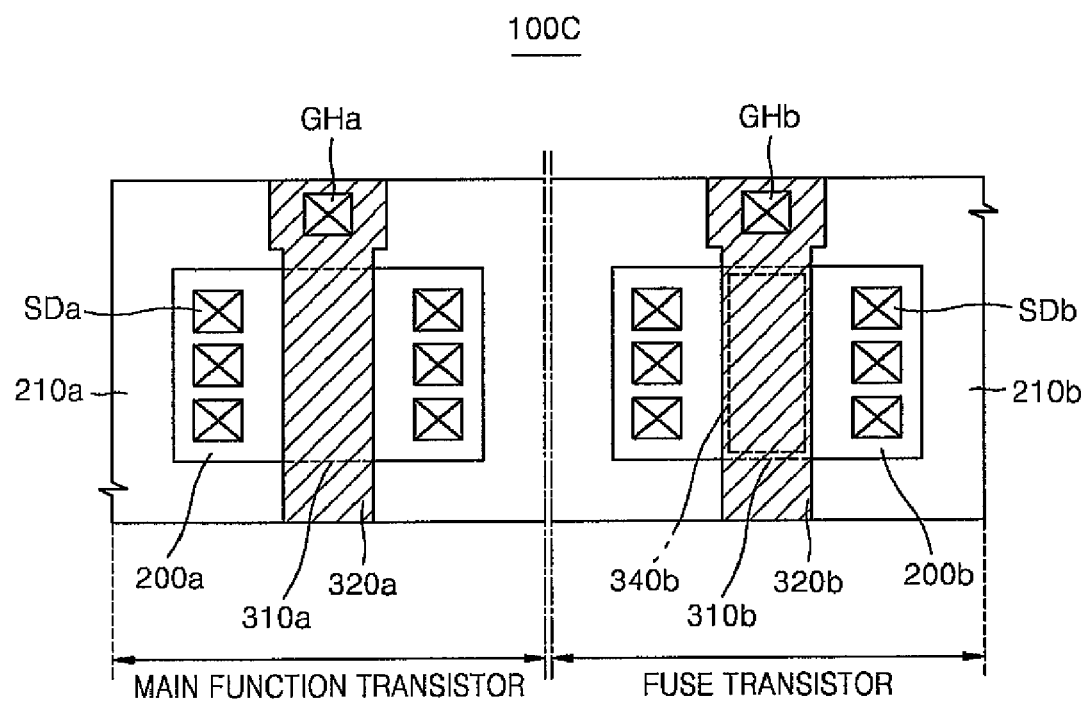

FIGS. 4A and 4B are related sectional and plan views illustrating a semiconductor integrated circuit 100C including a plurality of transistors according to another embodiment of the invention.

Referring to FIGS. 4A and 4B, the semiconductor integrated circuit 100C comprises a main function transistor and a fuse transistor, as described above. As is well known in the art, device isolation layers 210a and 210b are formed in semiconductor substrate to define active regions 200a and 200b, and gate insulation layers 310a and 310b and gate electrodes 320a and 320b are sequentially formed on the active regions 200a and 200b and then patterned to form gate stacks 300a and 300b. Spacers S are then formed on sidewalls of the gate stacks 300a and 300b, and then an ion implantation process is performed using the gate stacks 300a and 300b and the spacers S as an implantation mask, so that source/drain regions 400a and 400b can be formed.

In the above process for forming the main function transistor and the fuse transistor, the gate insulation layers 310a and 310b may be formed using a thermal oxidation process. After that, a mask (not shown) may be formed which exposes only the surface of the gate insulation layer 310b of the fuse transistor. Then, impurities are implanted by ion implantation process into the gate insulation layer 310b of the fuse transistor, so that only the gate insulation layer 310b of the fuse transistor can be damaged. A rectangle 340b illustrated in dotted lines represents an impurity region of the gate insulation layer 310b. The implanted impurities may be a nonmetallic element such as B, C, N, and Si, and/or may be metal elements such as Ta, Sn, In, and Ti.

The area of the gate insulation layer 310b which is implanted can be controlled by changing the open area of a mask to expose the surface of gate insulation layer 310b. For example, the entire area of the gate insulation layer 310b may be implanted by using a mask with open area to expose the whole surface of the gate insulation layer 310b and the surrounding region outside the gate insulation layer 310b.

The implanted impurities may function as a network modifier which invades into a network of a thermal oxidation layer of SiO2 having an amorphous structure, and changes electric properties of the gate insulation layer 310b. The implanted impurities may form a trap site of charged particles in the gate insulation layer 310b or form an additional surface state on an interface between the gate insulation layer 310b and the active region 200b, and thus may damage the gate insulation layer 310b.

Figure 5:
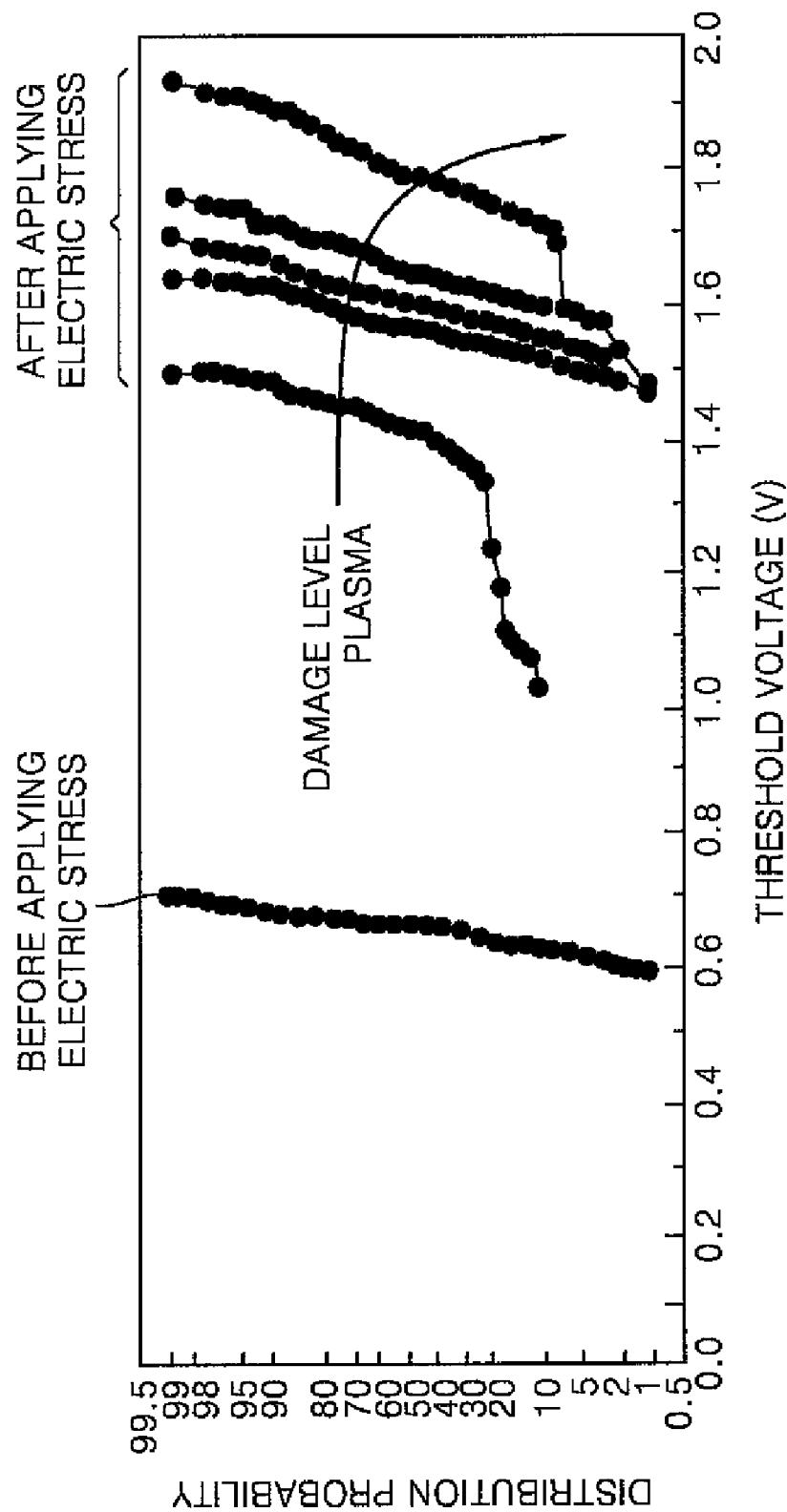
FIG. 5 is a graph illustrating variations of an initial threshold voltage for a fuse transistor including a damaged gate insulation layer and variations of the threshold voltage of the fuse transistor including the damaged gate insulation layer after applying voltage stress according to an embodiment of the invention.

Referring again to FIG. 1, any of the fuse transistors described above with reference to FIGS. 2A, 2B, 3A, 3B, 4A and 4B may be used as the electrical fuse 20. The control circuit 10 may apply a voltage stress to the gate electrode 320b of the electrical fuse 20. FIG. 5 is a graph illustrating variations between an initial threshold voltage and the threshold voltage after applying voltage stress of a fuse transistor including a damaged gate insulation layer according to an embodiment of the present invention. The horizontal axis represents a threshold voltage, and the vertical axis represents distribution probability of the threshold voltage.

Referring to FIG. 5, the initial threshold voltage of the fuse transistor ranges from 0.6 V to 0.7 V. After the voltage stress is applied to the gate electrode, the threshold voltage of the fuse transistor can be changed to between 1.4 V and 1.9 V. The variations of the threshold voltage are irreversible. As illustrated by an arrow, the more damaged the gate insulation layer is by plasma, the greater the threshold voltage. According to an embodiment of the present invention, the threshold voltage of the gate electrode may be easily changed by the electric stress of the control circuit 10.

The fuse transistor can be easily programmed using the threshold voltage variations of the fuse transistor. For example, when the control circuit 10 applies the voltage stress to the gate electrode of the fuse transistor, the threshold voltage of the fuse transistor is increased, and thus the fuse transistor can provide an open circuit. In this case, the fuse transistor functions as a fuse-type electrical fuse.

In another embodiment, a common terminal is provided to the source/drain regions of the fuse transistor and the voltage stress is applied to the gate electrode and the common terminal using the control circuit 10, and thus dielectric breakdown can occur in the gate insulation layer. Therefore, the fuse transistor can be programmed. In this case, the programmed fuse transistor can provide a closed circuit, and thus the fuse transistor functions as an anti fuse-type electrical fuse.

The active regions of the main function transistor and the fuse transistor are all formed on a same level in a semiconductor integrated circuit, but only exemplary embodiments and various changes may be made without departing from the scope of the present invention. The active regions of the main function transistor and the fuse transistor may have different levels. So the main function transistor and the fuse transistor formed on different levels may experience separately deposition, lithography processes, or etching processes.

At least one of gate insulation layers of the main function transistor and the fuse transistor may be formed of a nitride layer, an oxide layer, or an oxynitride layer. In addition, it will be understood by those of ordinary skill in the art that at least one of the main function transistor and the fuse transistor may have a flat channel as illustrated herein. In other embodiments, at least one of the main function transistor and the fuse transistor may have a vertical channel known in the art to enhance the integration density of a semiconductor integration circuit. In a vertical transistor, a trench region is formed in the active region, and the gate insulation layer is disposed on the trench region, and then the gate electrode is buried into the trench region to provide a vertical channel.

In addition, at least one of the main function transistor and the fuse transistor may operate in a depletion mode or an enhancement mode. A well can be provided in the active region of the fuse transistor as well as in the active region of the main function transistor. In addition, the active region of the semiconductor integrated circuit according to the present invention may be formed of silicon, silicon on insulator, silicon germanium, silicon arsenide, indium phosphide, or combination thereof. A substrate including the active region may be a wafer type or an isolated substrate may be packaged.

Embodiments of the invention provide a semiconductor integrated circuit including a transistor having a damaged gate insulated layer. The transistor is used as an electrical fuse, thereby reducing a driving voltage required for fuse programming. Therefore, a semiconductor integrated circuit according to an embodiment of the invention provides a more rapid and reliable programming process. In addition, the electrical fuse of the present invention functions as a fuse type or an anti-fuse type depending on the method of programming.

While the present invention has been particularly shown and described with reference to exemplary embodiments thereof, it will be understood by one of ordinary skill in the art that various changes in form and details may be made therein without departing from the scope of the invention as defined by the following claims.

What is claimed is:

1. A semiconductor integrated circuit comprising:
   a main function transistor formed on a first active region of a substrate and comprising:
      a first gate stack formed by a first gate insulation layer and a first gate electrode disposed in a first overlapping portion over the first gate insulation layer, and
      a first gate electrode contact electrically connected to the first gate electrode outside the first overlapping portion; and
   a fuse transistor or an anti-fuse transistor ("fuse/anti-fuse transistor") formed on a second active region of the substrate and comprising:
      a second gate stack formed by a second gate insulation layer having the same thickness as the first gate insulation layer, and a second gate electrode disposed over a second overlapping portion of the second gate insulation layer; and
      a second gate electrode contact electrically connected to the second gate electrode within the second overlapping portion and configured to apply voltage stress to damage the second gate insulation layer.

2. The semiconductor integrated circuit of claim 1, further comprising:
   a control circuit applying the voltage stress to the damaged the second gate insulation layer.

3. The semiconductor integrated circuit of claim 2, wherein the fuse/anti-fuse transistor is incorporated in a fuse.

4. The semiconductor integrated circuit of claim 3, wherein application of the stress voltage increases a threshold voltage applied to the damaged gate insulation layer.

5. The semiconductor integrated circuit of claim 2, wherein the voltage stress breakdowns the second gate insulation layer and the fuse/anti-fuse transistor is incorporated in an anti-fuse.

6. The semiconductor integrated circuit of claim 5, wherein the stress is applied to a common terminal electrically connected to source/drain regions and the second gate electrode of the fuse/anti-fuse transistor.

7. The semiconductor integrated circuit of claim 1, wherein the second gate insulation layer comprises at least one of a nitride layer, an oxide layer, and an oxynitride layer.

8. The semiconductor integrated circuit of claim 1, wherein the semiconductor integrated circuit comprises at least one of a microprocessor, a digital signal processor, a memory device, and an analog device.

9. The semiconductor integrated circuit of claim 1, wherein the first and second active regions are respectively a flat channel or a vertical channel.

10. The semiconductor integrated circuit of claim 1, wherein the substrate is formed from at least one material selected from a group of materials consisting of; silicon, silicon germanium, silicon arsenide, and indium phosphide.

* * * * *